United States Patent
Zienkewicz et al.

(10) Patent No.: US 8,957,722 B2
(45) Date of Patent: Feb. 17, 2015

(54) WIDEBAND DOUBLE BALANCED IMAGE REJECT MIXER

(71) Applicant: ViaSat, Inc., Carlsbad, CA (US)

(72) Inventors: Rob Zienkewicz, Chandler, AZ (US); Kenneth Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 14/042,054

(22) Filed: Sep. 30, 2013

(65) Prior Publication Data

US 2014/0091849 A1     Apr. 3, 2014

Related U.S. Application Data

(60) Provisional application No. 61/707,755, filed on Sep. 28, 2012.

(51) Int. Cl.
*G06G 7/12* (2006.01)
*H03D 7/14* (2006.01)
*H03D 7/16* (2006.01)
*H03D 7/18* (2006.01)

(52) U.S. Cl.
CPC ............. *H03D 7/1458* (2013.01); *H03D 7/165* (2013.01); *H03D 7/18* (2013.01); *H03D 2200/0082* (2013.01)
USPC ........... 327/355; 327/361; 455/313; 455/318; 455/323

(58) Field of Classification Search
CPC ... H03D 7/1441; H03D 7/125; H03D 7/1433; G06G 7/14; G06G 7/163; G06G 7/161; G06G 7/26; G06J 1/00
USPC .......... 327/355, 356, 357, 361; 455/313, 314, 455/315, 318, 319, 323–326
See application file for complete search history.

(56) References Cited

U.S. PATENT DOCUMENTS

| 6,421,028 B1 * | 7/2002 | Ohgren et al. ................ 343/895 |
| 6,653,987 B1 * | 11/2003 | Lamensdorf et al. ......... 343/895 |
| 7,130,599 B2 * | 10/2006 | Persico et al. ................ 455/147 |

(Continued)

FOREIGN PATENT DOCUMENTS

| WO | 02/37787 | 5/2002 |
| WO | 03/061112 | 7/2003 |

OTHER PUBLICATIONS international Search Report and Written Opinion for PCT/US2013/062499 dated Dec. 6, 2013.

*Primary Examiner* — Lincoln Donovan
*Assistant Examiner* — Thomas Skibinski
(74) *Attorney, Agent, or Firm* — Snell & Wilmer L.L.P.

(57) ABSTRACT

A double balanced image reject mixer (IRM) can be configured to comprise: a common radio frequency (RF) port; four mixer devices, each comprising an intermediate frequency (IF) port, an RF port and an local oscillator (LO) port; and a four-way, in-phase splitter/combiner. The four-way, in-phase splitter/combiner can be connected between the RF common port and the RF port of each of the four mixer devices. A method of performing spurious suppression and image reject mixing in a double balanced IRM, can comprise: directly in-phase combining radio frequency (RF) output signals of four mixer devices located in the double balanced IRM; and phase pairing local oscillator (LO) signals and intermediate frequency (IF) signals such that the combination of the phases of the respective IF and LO signals can result in substantially equal phase RF signals at the RF ports of all four mixer devices.

12 Claims, 6 Drawing Sheets

(56) References Cited

U.S. PATENT DOCUMENTS 8,004,342 B2 * 8/2011 Huang et al. .................. 327/355
2009/0143031 A1 6/2009 Shah
2011/0018774 A1 * 1/2011 Kikin ........................... 343/728
2011/0115571 A1 * 5/2011 Nakamura et al. ............ 332/105

* cited by examiner

WIDEBAND DOUBLE BALANCED IMAGE REJECT MIXER

CROSS-REFERENCE TO RELATED APPLICATIONS

This application claims priority to U.S. Provisional Application No. 61/707,755, entitled "Wideband RF Mixer," which was filed on Sep. 28, 2012, the contents of which are hereby incorporated by reference for any purpose in their entirety.

FIELD OF INVENTION

The present disclosure relates generally to image reject mixers in radio frequency (RF) devices, and specifically to high bandwidth double balanced image reject mixers.

BACKGROUND

An image reject mixer can be useful in RF upconversion/downconversion, as when mixing a local oscillator (LO) frequency with an intermediate frequency (IF) signal to generate an RF signal. The image reject mixer (IRM) can be useful for eliminating or reducing image noise from an unwanted sideband. Unfortunately, common image reject mixers tend to cause the bandwidth of the system they are in to be restrictively limited. For example, conventional image reject mixers can comprise RF switches and/or RF baluns located (electronically) between the RF port of the mixers and a RF common port. Such devices can limit the bandwidth of the IRM.

Therefore, it is desirable to develop new IRM technology that is less bandwidth limited.

SUMMARY

A double balanced image reject mixer (IRM) can be configured to comprise: a common radio frequency (RF) port; four mixer devices, each comprising an intermediate frequency (IF) port, an RF port and an local oscillator (LO) port; and a four-way, in-phase splitter/combiner. The four-way, in-phase splitter/combiner can be connected between the RF common port and the RF port of each of the four mixer devices.

A double balanced image reject mixer can be configured to comprise a first mixer device, a second mixer device, a third mixer device, and a fourth mixer device. Each of the first through fourth mixer devices can comprise a mixer radio frequency (RF) port, a mixer local oscillator (LO) port, and a mixer intermediate frequency (IF) port. Each of the first through fourth mixer devices can be configured to connect the respective mixer IF port to one of first through fourth IF signals, wherein each of the first through fourth IF signals can be from a common IF signal and can be 90° out of phase with two of the other first through fourth IF signals, The double balanced IRM can further comprise a four phase quadrature local oscillator (LO) generator configured to receive an LO input signal, wherein the four phase quadrature LO generator can be configured to generate first through fourth LO signals based on the LO input signal, and to provide said first through fourth LO signals to respective mixer LO ports of the first through fourth mixer devices. The double balanced IRM can further comprise an RF common port, wherein the RF common port can be directly connected to each of the mixer RF ports of the first through fourth mixer devices, wherein each of the first through fourth LO signals can be 90° out of phase with two of the other first through fourth LO signals; and wherein RF signals can be in-phase combined/split between the RF common port and the mixer RF ports of the first through fourth mixer devices.

A method of performing spurious suppression and image reject mixing in a double balanced image reject mixer (IRM), can comprise: directly in-phase combining radio frequency (RF) output signals of four mixer devices located in the double balanced IRM; and phase pairing local oscillator (LO) signals and intermediate frequency (IF) signals, wherein each phase paired pair of LO and IF signals can be mixed at a respective mixer device of the four mixer devices, and wherein the phase pairing can be configured such that the combination of the phases of the respective IF and LO signals can result in substantially equal phase RF signals at the RF ports of all four mixer devices.

BRIEF DESCRIPTION OF THE DRAWING FIGURES

Additional aspects of the present invention will become evident upon reviewing the non-limiting embodiments described in the specification and the claims taken in conjunction with the accompanying figures, wherein like numerals designate like elements, and:

DETAILED DESCRIPTION

Figure 1:
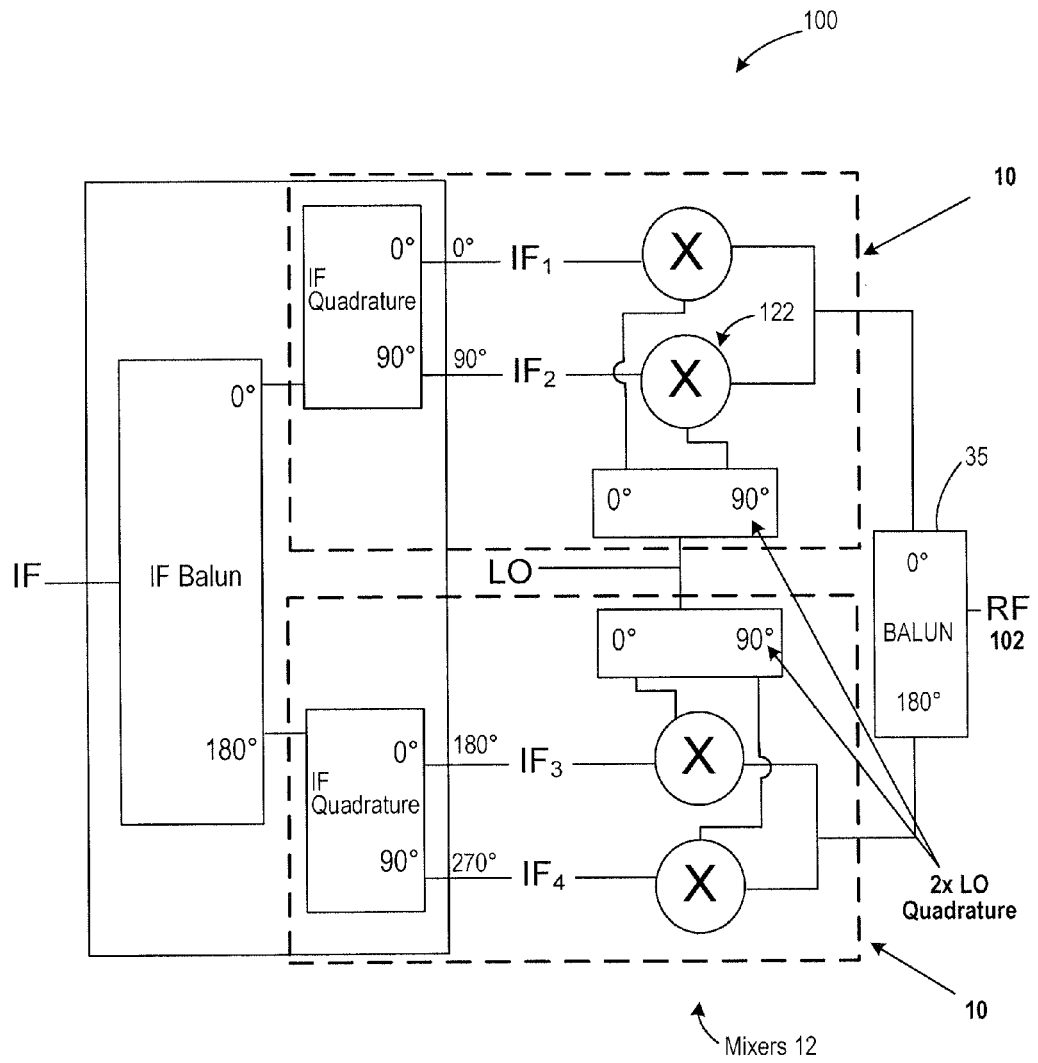
FIG. 1 is a schematic block drawing of a conventional double balanced IRM configuration, further comprising RF baluns.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles illustrated herein, which would occur to one skilled in the relevant art and having possession of this disclosure, are to be considered within the scope of this disclosure.

With momentary reference to FIG. 1, a conventional double balanced IRM 10 can comprise an RF balun 35 located (electronically) between the mixer devices 12 and an RF common output 102. In such implementations, the RF balun has a limited bandwidth, and causes the entire IRM to be bandwidth limited accordingly. Some efforts have been made to overcome the bandwidth limitations of the RF balun by including RF switches to swap out one RF balun for another RF balun associated with a different operational frequency band. Unfortunately, locating RF switches between the mixer and the RF common port can also limit the bandwidth of the IRM. Although this approach can work, switch and RF balun variation can make it difficult to maintain tight amplitude and phase balance over wide RF bandwidths. In various embodiments, the RF balun used in these circumstances may need to have a very high phase and amplitude accuracy in order to work to suppress (vector cancel) spurs in a balanced mixer configuration. Moreover, these components can be inherently bandwidth limiting. And extending the bandwidth for this mixer to cover multiple octaves for either reconfigurable bandwidth applications or wide bandwidth applications can be difficult because the topology can be band limited by the balun.

With continued reference to FIG. 1, it is further noted that various methods exist for creating the LO signals that can be provided to the mixer devices 12. For example, Lange or other hybrid methods may be used depending on, for example, the frequency range of interest. Moreover, the wiring of this IRM combines the RF ports of the 0° and the 90° mixer devices, and combines the RF ports of the 180° and the 270° mixer devices. Thus, the two top paired mixer outputs are in phase with each other and the two bottom pair mixer outputs are in phase with each other. But the two sets of pairs are not in phase with each other. This structural arrangement gives rise to the use of the balun 35. This is not merely a design choice, because to combine all the RF mixer device ports directly in this case would inoperably result in cancellation of the desired signal and summing of some undesired spurs.

In accordance with an example embodiment, a double balanced image reject mixer (IRM) can comprise four mixer devices, a four phase quadrature local oscillator (LO) generator, and a four-way splitter/combiner. In general, a double balanced IRM can comprise a device that can be configured to eliminate or reduce image noise in an unwanted sideband. The double balanced IRM can achieve this by taking advantage of the phase difference between the two sidebands wherein the upper and lower sidebands are substantially 180 degrees out of phase after conversion. Therefore, by separating the signal and frequency and converting it with quadrature LO signals, one sideband can be configured to sum in-phase while the other cancels.

Described another way, in high performance mixer topologies, in an example embodiment, vector cancellation can be used to provide spurious suppression and image rejection. For "perfect" vector cancellation, the amplitude of both signals must be identical and the phases must be exactly opposite or 180° apart from each other. If either of these criteria are not met, a small resultant vector remains which in practical terms manifests itself as degraded spurious suppression and/or image rejection.

Each mixer device of the double balanced IRM can comprise an intermediate frequency (IF) port, a radio frequency (RF) port, and an LO port. The double balanced IRM can be configured to perform image reject mixing by directly splitting/combining the signals at the RF ports of the four mixer devices. In another example embodiment, the double balanced IRM can be configured to perform image reject mixing by phase pairing LO signals, from the four phase quadrature LO generator, to the IF signals of the respective mixer of the four mixer devices. This pairing can be accomplished for example, by connecting the 0° LO port, of the four phase quadrature LO, to the mixer device that receives the 0° IF signal, and similarly pairing the 90°, 180°, and 270° LO ports and respective mixers.

More generally, the double balanced IRM can be configured so that the phase of a particular mixer device output signal can be equal to the difference between the phases of the two input signals. Thus, in an example embodiment, the double balanced IRM can be configured so that the desired RF signals from each mixer will always be in-phase relative to each other and thus can be combined without the use of bandwidth limiting circuits. In this manner, a double balanced IRM can be used in high performance, multi-octave bandwidth, frequency agile receivers. The double balanced IRM can be wide bandwidth and high linearity, making it very useful in a variety of applications.

Figure 2:
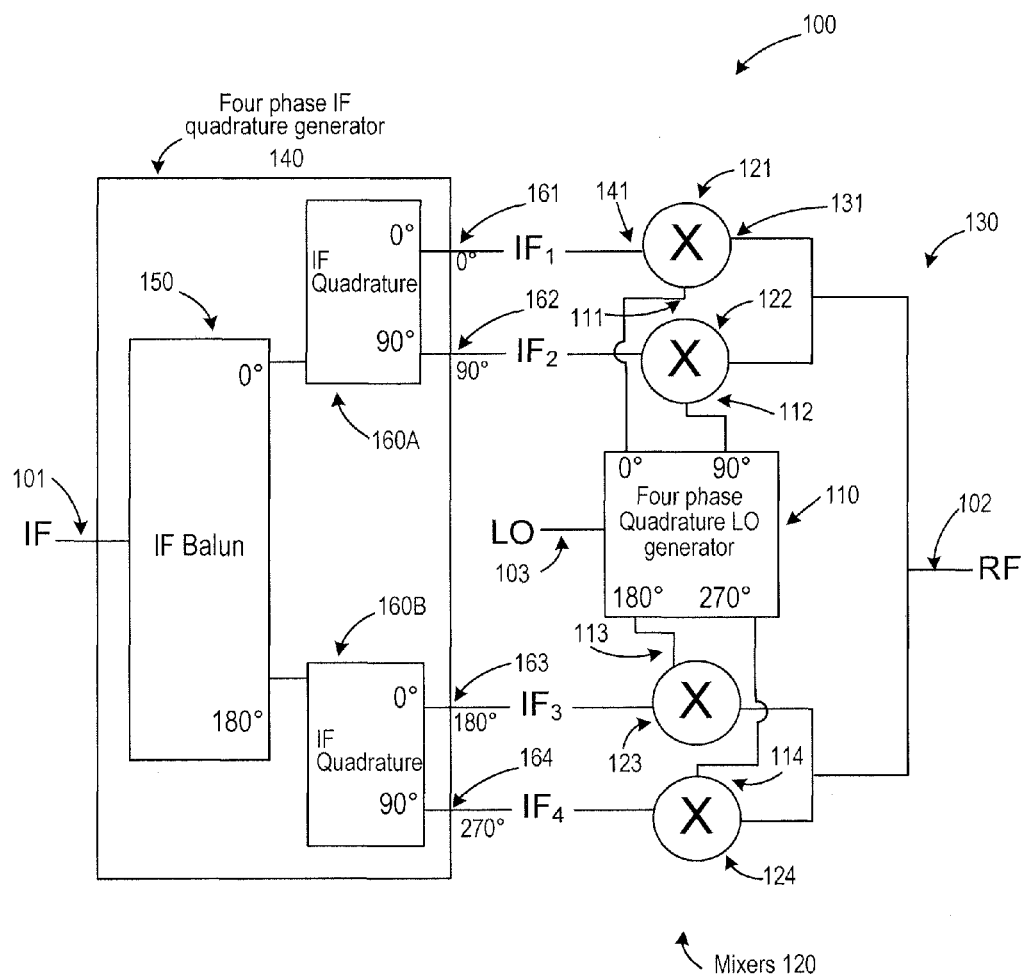
FIG. 2 is a schematic block drawing of an example double balanced IRM.

With reference now to FIG. 2, in an example embodiment, a double balanced image reject mixer (IRM) 100 can comprise four mixer devices (121, 122, 123 and 124), and a four-way splitter/combiner 130. Double balanced IRM 100 can further comprise a four phase quadrature LO generator 110. Each of the four mixer devices can comprise an IF port, a RF port, and an LO port. For example, mixer 121 can comprise IF port 141, RF port 131, and LO port 111. IF port 141 can be configured to communicate an IF signal, e.g., $IF_1$.

In one example embodiment, mixer 121 can be configured to receive an IF signal, $IF_1$, at IF port 141, receive an LO signal, $LO_1$, at LO port 111, up-convert $IF_1$ to an RF signal, $RF_1$, and output the RF signal on RF port 131. In another example embodiment, mixer 121 can be configured to receive an RF signal, $RF_1$, at RF port 131, receive an LO signal, $LO_1$, at LO port 111, downconvert $RF_1$ to an IF signal, $IF_1$, and output the IF signal on IF port 141. In an example embodiment, the four mixer devices can be FET mixer devices.

In an example embodiment, the double balanced IRM 100 can comprise a four-way splitter/combiner 130. In an example embodiment, the four-way splitter/combiner 130 can comprise a four-way in-phase splitter/combiner. The four-way splitter/combiner can be connected between a RF common port 102 and the RF port of each of the four mixer devices (e.g., RF port 131, etc.). The term "four-way splitter" can be used to indicate an electrical structure that can be configured to divide an RF signal into four RF signals. Similarly, the term "four-way combiner" can be used to indicate an electrical structure that can be configured to combine four RF signals into a single RF signal. It is noted that the same structure can be used in a system that comprises: a transmitter, a receiver, or a transceiver. It is noted that in a transceiver type embodiment, a combiner in the double balanced IRM from the transmit perspective can be a splitter from the receive perspective. Thus, in an example embodiment, the splitter/combiner, can be a passive reciprocal structure. In fact the double balanced IRM can be considered a reciprocal structure.

Similarly, a mixer can be configured to up-convert an IF signal to an RF signal from a transmit perspective, or down convert an RF signal to an IF signal from a receive perspective. Therefore, for sake of clarity in discussing the example embodiments, the examples disclosed herein are generally discussed herein from a transmit perspective. Stated another way, examples discussed herein are generally with reference to up-converting an IF signal to an RF signal in each of the four mixer devices and providing the four RF signals from each mixer to a four-way combiner that has a single, common RF output port. Nevertheless, the use of such language to identify the components of the device is not intended to limit the scope of the description of the invention to only a transmit type device. It should be understood that the same splitter/combiner 130 may be used in a receiver context or a transceiver context, with the parts denominated as fits the respective perspective.

An example splitter/combiner 130 can comprise a single RF output port connected to four RF mixer input ports (e.g., 131). In another example embodiment, and stated in terms that are not transmit/receive dependent, splitter/combiner 130 can comprise a first RF port 131, a second RF port, a third RF port, and a fourth RF port all connected directly to a fifth RF port 102. In this example embodiment, the fifth RF port 102 can be an RF common port 102. The RF common port can be configured to communicate an RF signal comprising the signals communicated via the first, second, third and fourth RF ports. The first, second, third and fourth RF ports can each be configured to communicate a portion of the composite signal communicated by RF common port 102.

In one example embodiment, the RF splitter/combiner can be an equal way splitter/combiner. An equal way splitter/combiner can be configured to divide an RF signal into four equal strength RF signals having the same frequency as the original RF signal. Thus, the splitter/combiner can comprise a device configured to directly combine the RF signals at the RF ports of each of the four mixer devices to a RF common port. In an example embodiment, the respective RF signals at each RF port of each of the four mixer devices can be split/combined in-phase to create a common RF signal at a RF common port. Stated another way, the RF common port can be connected to a four-way in-phase power splitter/combiner between the RF common port and each of the four mixer devices.

In an example embodiment, the splitter/combiner can be configured so that no switches are located between the RF port of mixer devices (121, 122, 123, 124) and RF common port 102. In an example embodiment, the splitter/combiner can be configured so that no RF balun is located between the RF port of mixer devices (121, 122, 123, 124) and RF common port 102. In an example embodiment, the splitter/combiner can be configured so that no RF switched filter banks or RF 90° hybrids are located between the RF port of mixer devices (121, 122, 123, 124) and RF common port 102. The absence of one or more of these four components can be useful in facilitating a wideband double balanced IRM. Thus, in an example embodiment, the double balanced IRM can comprise an absence of one or more of: an RF balun, an RF switch(es), an RF 90° hybrid, and RF switched filter banks.

Thus, in an example embodiment, the double balanced IRM can be unlimited in bandwidth by any RF Baluns, RF switches, RF 90° hybrids, and/or RF filter banks that are located between the RF common port and each of the four mixer devices. Stated another way, in an example embodiment, because there are not any RF Baluns, RF switches, RF 90° hybrids, or RF filter banks, no bandwidth limitations of the double balanced IRM can be attributed to such elements.

Four Phase Quadrature LO Generator

In an example embodiment, double balanced IRM 100 can comprise a four phase quadrature LO generator 110. Four phase quadrature LO generator 110 can be configured to receive an LO common signal at LO common port 103. Four phase quadrature LO generator 110 can be configured to output four LO signals ($LO_1$, $LO_2$, $LO_3$, $LO_4$). In an example embodiment, four phase quadrature LO generator 110 can be configured to cause each of the four LO signals to be 90° phase shifted from two of the other three LO signals. For example, $LO_1$ can be phase shifted 0° relative to the LO common signal, $LO_2$ can be phase shifted 90° relative to the LO common signal, $LO_3$ can be phase shifted 180° relative to the LO common signal, and $LO_4$ can be phase shifted 270° relative to the LO common signal. Moreover, four phase quadrature LO generator 110 can be configured to generate four LO signals that are phase shifted 90° from one to the next. In accordance with an example embodiment, the phase difference between the four LO signals from four phase quadrature LO generator 110 can be relative phase shifts. For example, the orthogonal relationship of the four LO signals can be shifted relative to the LO common signal a suitable amount. For example, $LO_1$ may be phase shifted 3° from the LO common signal, in which case $LO_2$ would be phase shifted 93° from the LO common signal and $LO_3$ 183° and $LO_4$ 273°.

Thus, four phase quadrature LO generator 110 can be configured to receive an LO common signal and to provide an individual LO signal ($LO_1$, $LO_2$, $LO_3$, $LO_4$) to each of the four mixer devices (121, 122, 123, 124 respectively). In an example embodiment, each individual LO signal can be based on the LO common signal. Moreover, each individual LO signal can be 90° out of phase with two of the other individual LO signals.

In an example embodiment, the four phase quadrature LO generator can be a digital four phase quadrature LO generator. The digital four phase quadrature LO generator can be configured to digitally create four LO signals with very accurate phase and amplitude control. In other words, the desired orthogonal phase differences between the LO signals can be made substantially or very accurately.

Figure 6:
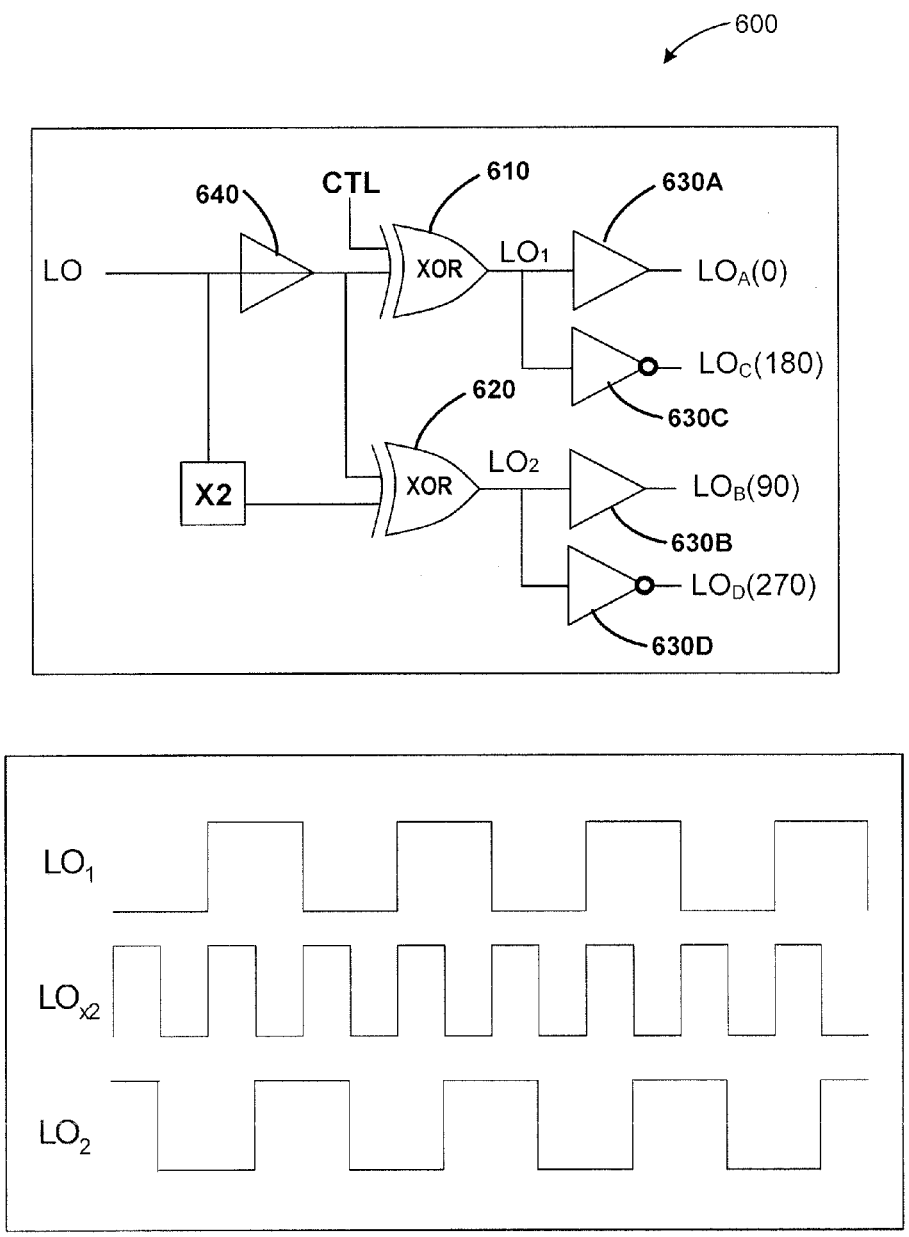
FIG. 6 is a schematic drawing of a digital local oscillator quadrature circuit.

With momentary reference now to FIG. 6, one example digital four phase quadrature LO generator 600 can comprise a common LO input port, and four LO output ports ($LO_A$, $LO_B$, $LO_C$, $LO_D$). A first XOR 610 can be configured to receive the common LO signal by way of an operational amplifier (OpAmp) 640 and to output $LO_A$ (0°) through OpAmp 630A and $LO_C$ (180°) through Inverting OpAmp 630C. A second XOR 620 can be configured to receive the common LO signal by way of OpAmp 640 and to output $LO_B$ (90° through OpAmp 630B and $LO_D$ (270°) through Inverting OpAmp 630D. XOR 620 can further receive at its other input a frequency doubled common LO signal. By driving the digital quadrature circuit with a clock signal at the LO frequency, very (substantially) accurate quadrature signals can be derived. In other example embodiments, a digital four phase quadrature LO generator can be created using digital flip-flops and buffer amps, or through other methods.

It is noted that XOR 610 can, in some example embodiments, be configured to receive a control signal CTL at its other input. The control signal can be configured to toggle between high side or low side upconversion. Thus, although described herein as pairing (0-0, 90-90, 180-180, and 270-270), in one embodiment, toggling CTL can cause pairing (0-90, 90-0, 180-180, and 270-270) as just one example. The CTL can cause the resultant phasing such that the low side signals combine in phase and the high side signals destructively add. It is further noted that although this high side/low side switching has been illustrated in this example with respect to switching LO signals, such switching of signals could be performed on the four IF signals or the four RF signals as well with the same effect.

It should be understood that although it has been stated that for ideal cancellation, the phase shifting should be precisely 90°, and the like, that this is an approximation. In various example embodiments, the phase accuracies can be within two degrees, one degree, or even ³/₁₀th of a degree accurate. Nevertheless, the digital four phase LO quadrature circuit described herein can be more accurate than that. In an example embodiment, the digital four phase LO quadrature generator can be as accurate as the gate delays of the circuit.

Connection of the Four Phase Quadrature LO Generator to the Four Mixer Devices:

In addition, in an example embodiment, the individual LO signals ($LO_1$, $LO_2$, $LO_3$, $LO_4$), from the four ports (0°, 90°, 180°, 270°) of the four phase quadrature LO generator, can be paired with the respective IF signals ($IF_1$, $IF_2$, $IF_3$, $IF_4$) communicated through the respective mixer of the four mixer devices (121, 122, 123, 124). Therefore, four phase quadrature LO generator 110 can be configured to phase shift the LO output signals ($LO_1$, $LO_2$, $LO_3$, $LO_4$), by 0°, 90°, 180°, and 270° respectively (or by those amounts plus or minus a common phase shift). In other words, in an example embodiment, the four output signals are relatively spaced 90° from one to the next. It is noted then that the four LO signals could be phase shifted relative to the LO common signal by 3°, 93°, 183°, and 273°, respectively and still be orthogonal to each other as described herein.

In accordance with an example embodiment, the mixing performed in mixer devices (121, 122, 123, and 124) can be represented by the following equations:

$$\Theta_{RF1} = \Theta_{IF1} - \Theta_{LO1}$$

$$\Theta_{RF2} = \Theta_{IF2} - \Theta_{LO2}$$

$$\Theta_{RF3} = \Theta_{IF3} - \Theta_{LO3}$$

$$\Theta_{RF4} = \Theta_{IF4} - \Theta_{LO4}$$

In these equations, $\Theta$ represents the phase of the signal for the respective port of the respective mixer denoted by the subscripts. In an example embodiment, the double balanced IRM can be further defined by the equation: $\Theta_{RF1} = \Theta_{RF2} = \Theta_{RF3} = \Theta_{RF4}$. In an example embodiment, double balanced IRM 100 can be designed to connect the orthogonal LO signals to respective mixers to make this equation true. For example, with reference to FIG. 1, $\Theta_{RF1} = \Theta_{RF2} = \Theta_{RF3} = \Theta_{RF4} = 0°$. Thus, all four RF output signals from the four mixers can be in-phase combined.

Figure 5:
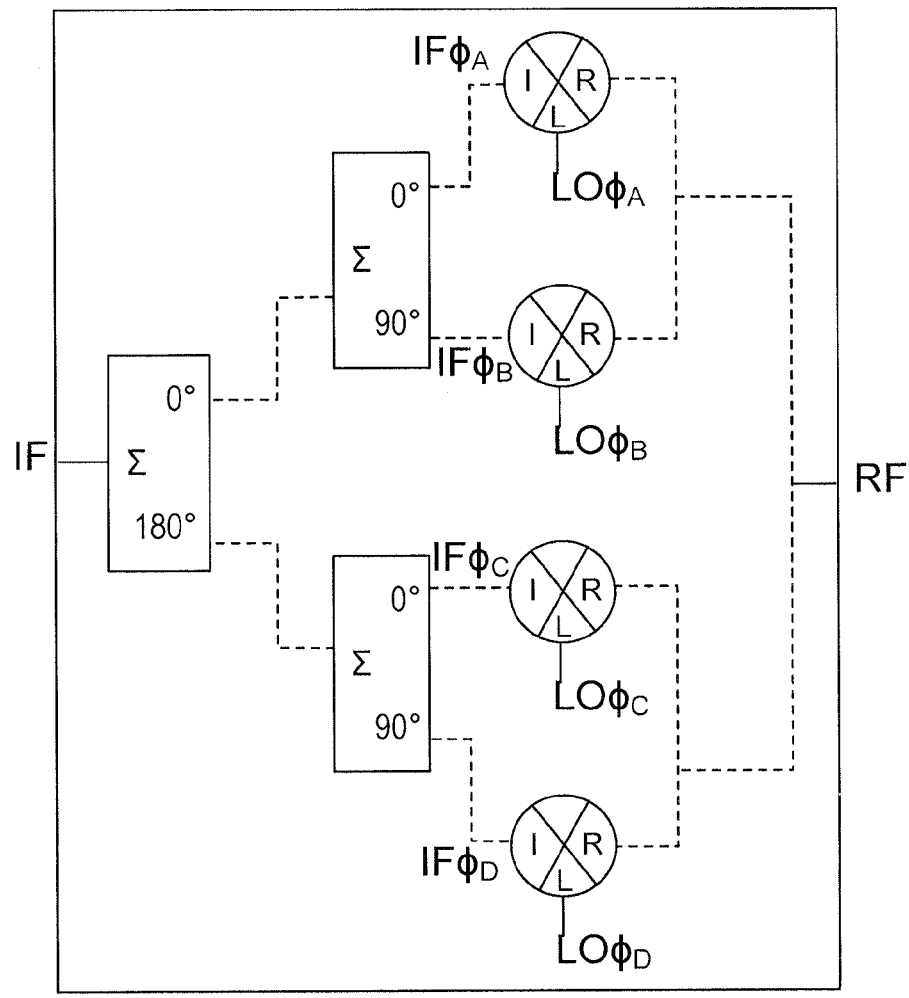
FIG. 5 is another schematic block drawing of an example double balanced IRM.

In accordance with an example embodiment, with reference to FIG. 2 and to FIG. 5, double balanced IRM 100 can be configured so that the signal at all four mixer RF ports is in-phase and can be summed directly. Double balanced IRM 100 can be configured such that the difference between the phases of the IF and LO signals in each mixer is always the same. In other words, there can be a difference between the common IF signal and the LO signal, and double balanced IRM 100 can be configured so that the 0° phase shifted IF signal can be mixed with the 0° phase shifted LO signal, and so forth for each 90°/90°, 180°/180°, 270°/270° pair (or the like if all shifted by some amount X°). In another example embodiment, the signals could also be paired such as 0°/90°, 90°/180°, 180°/270°, 270°/0° which results in an in-phase signal of 90° relative to the input port on all four RF outputs. Because the phases are still the same, they can be summed directly. Therefore, in an example embodiment, any pairing that results in substantially equal phase at all mixer RF ports can be used.

Thus, the RF output of each mixer device can be in-phase with all the other RF outputs. This facilitates direct in-phase combining of the four RF output signals. In this example embodiment, the double balanced IRM can be configured so that the mixing facilitates spurious suppression and image rejection. Stated another way, in an example embodiment, the double balanced IRM can be configured to mix IF and LO signals such that the resulting RF signals are in-phase to facilitate frequency conversion, but the opposite sideband is out of phase to facilitate image rejection and spurious suppression.

In an example embodiment, double balanced IRM 100 can be configured to cancel $2^{nd}$ and $3^{rd}$ order spurs. The higher order spurs are generally out of band and/or lower power, and therefore can cause less noise.

Four Phase IF Quadrature Generator

In a further example embodiment, double balanced IRM 100 can further comprise a four phase IF quadrature generator 140. Four phase IF quadrature generator 140 can comprise a combination of IF balun(s) and IF quadrature(s). In an example embodiment, an IF balun can be a suitable balun configured to split/combine an IF signal from/to an IF common signal into/from 180° balanced signals. Thus, the IF balun can comprise a common port and one 0° port and one 180° port. In an example embodiment, the IF quadrature(s) can be a suitable IF quadrature configured to split/combine an IF signal into/from orthogonal signals. Thus, the IF quadrature can comprise a common port, one 0° port, and one 90° port.

In a first example embodiment, and with continued reference to FIG. 2, four phase IF quadrature generator 140 can comprise an IF balun 150, two IF quadratures (160A, 160B), and four IF ports (161, 162, 163, 164). In this example embodiment, IF balun 150 can comprise an IF common port 101. IF balun 150 can further be connected in series to a first IF quadrature 160A and to a second IF quadrature 160B, where the first IF quadrature 160A can be connected in parallel with the second IF quadrature 160B. Stated another way, the four phase IF quadrature generator can comprise an IF balun in series with two parallel 0°/90° quadratures. First IF quadrature 160A can be configured to connect to the first four phase IF quadrature generator port 161 and to the second four phase IF quadrature generator port 162. Second IF quadrature 160B can be configured to connect to the third four phase IF quadrature generator port 163 and to the fourth four phase IF quadrature generator port 164. In this example embodiment, IF balun 150 can be configured to convert between the IF common signal and first and second balun signals that are 180° out of phase from each other. Also, the first IF quadrature can be configured to convert the first balun signal into two signals that are orthogonal from each other, and the second IF quadrature can be configured to convert the second balun signal into two signals that are orthogonal from each other. In an example embodiment, the first through fourth IF signals ($IF_1$, $IF_2$, $IF_3$, $IF_4$) can be the outputs of the two IF quadratures.

Figure 3:
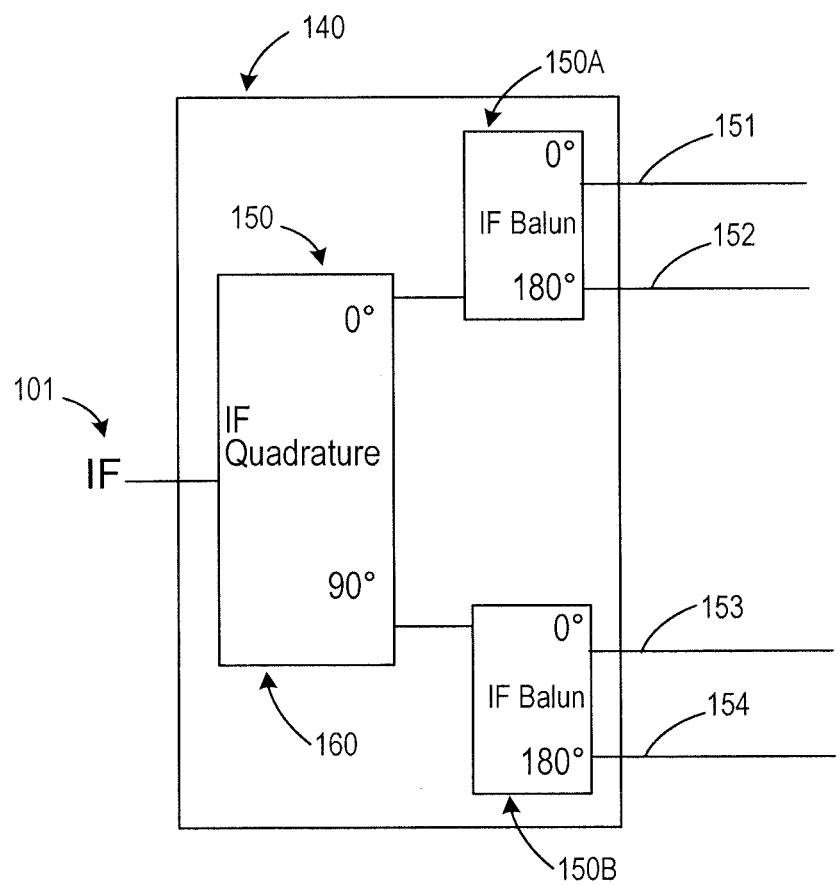
FIG. 3 is a schematic block drawing of an example four phase IF quadrature generator.

In a second example embodiment, and with reference to FIG. 3, four phase IF quadrature generator 140 can comprise an IF quadrature 160, and two IF baluns (150A, 150B), and four IF ports (151, 152, 153, 154). In this example embodiment, IF quadrature 160 can comprise an IF common port 101. IF quadrature 160 can further be connected in series to a first IF balun 150A and to a second IF balun 150B, where the first IF balun 150A can be connected in parallel with the second IF balun 150B. Stated another way, the four phase IF quadrature generator can comprise a single 0°/90° quadrature in series with two parallel baluns. First IF balun 150A can be configured to connect to the first four phase IF quadrature generator port 151 and to the second four phase IF quadrature generator port 152. Second IF balun 150B can be configured to connect to the third four phase IF quadrature generator port 153 and to the fourth four phase IF quadrature generator port 154. Thus, four phase IF quadrature generator 140 can be configured to generate the first through fourth IF signals ($IF_1$, $IF_2$, $IF_3$, $IF_4$) from a common IF signal at IF common port 101.

It is noted that the baluns and quadratures in the four phase IF quadrature generator can also be band limiting in nature, but existing technologies can provide suitable bandwidth to not significantly impact their usefulness of the mixer design. Also, in accordance with an example embodiment, a polyphase filter can be connected to the IF common port.

Figure 4:
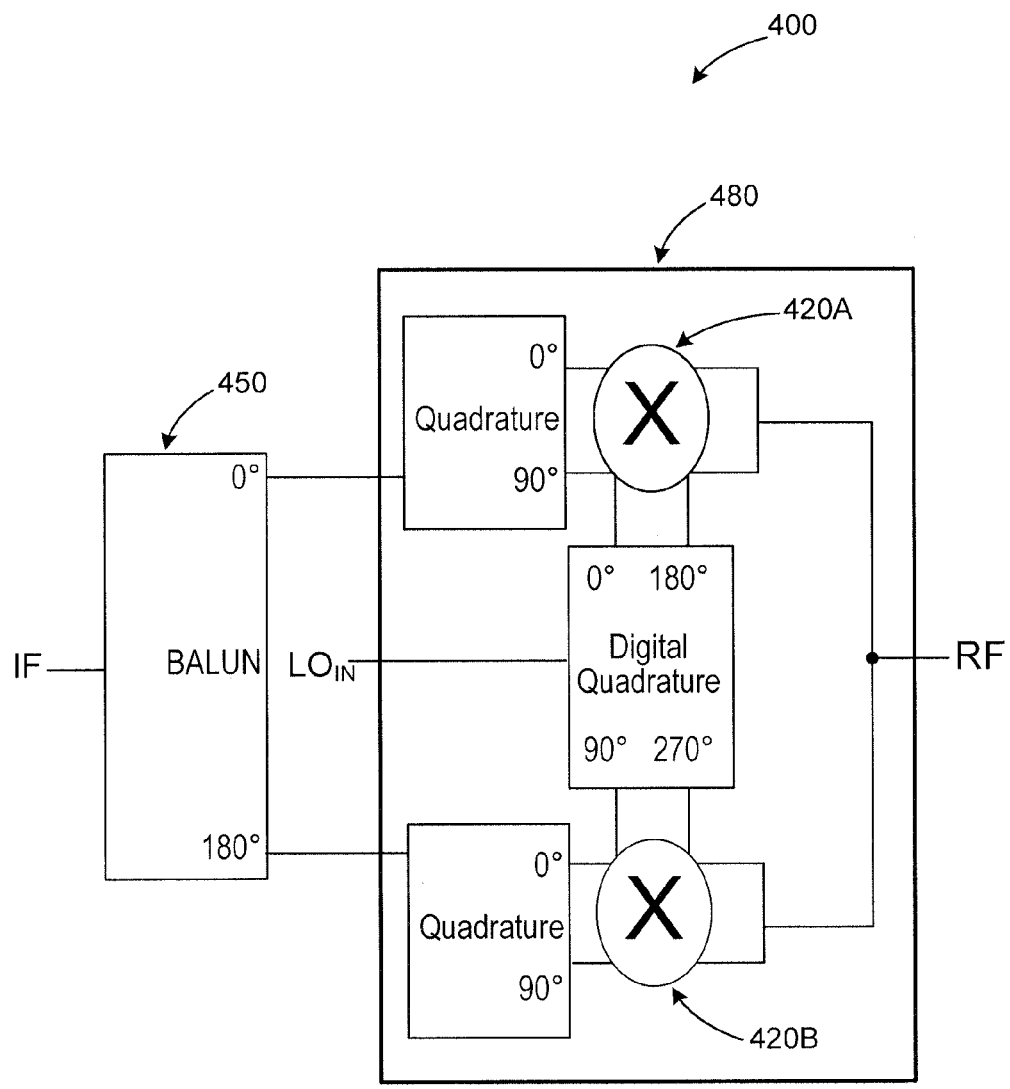
FIG. 4 is a schematic block drawing of an example double balanced IRM implemented at least partially on a chip.

In accordance with an example embodiment, and with reference to FIG. 4, double balanced IRM 400 can be implemented, or at least partially implemented, on a monolithic integrated circuit chip (MMIC) 480. For example, in one example embodiment, the IF balun 450 of the four phase IF quadrature generator can be "off-chip" and the IF quadratures of the four phase IF quadrature generator can be implemented "on-chip" with the mixer devices, four phase quadrature LO generator, and RF splitter/combiner. Moreover, more or less components may be implemented on a MMIC. In one example embodiment, the mixer devices can comprise differential mixer devices 420A and 420B.

In an example embodiment, double balanced IRM 100 can be configured to be a high performance, multi-octave, frequency agile, high-linearity, wide band double balanced IRM. For example, wideband can comprise 100 MHz to 30 GHz, or 400 MHz to 18 GHz. However, wideband can be any width considered to be wide by those in the art. By way of comparison, conventional IRM's can be limited to about 3:1. In accordance with other example aspects, double balanced IRM can be configured for greater than 40 dB spurious suppression and image rejection over these wide bandwidths compared to the prior art where only 25-30 dB suppression can typically be achieved. This can result in improved spur free dynamic range (recognized by those skilled in the art as an important figure of merit for a receiver system).

In an example embodiment, a method of performing spurious suppression and image reject mixing in a double balanced image reject mixer (IRM), can comprise: directly in-phase combining radio frequency (RF) output signals of four mixer devices located in the double balanced IRM; and phase pairing local oscillator (LO) signals and intermediate frequency (IF) signals. In an example embodiment, each phase paired pair of LO and IF signals can be mixed at a respective mixer device of the four mixer devices. Moreover, the phase pairing can be configured such that the combination of the phases of the respective IF and LO signals can result in equal (or substantially equal) phase RF signals at the RF ports of all four mixer devices.

In describing the present invention, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be appreciated that the particular implementations shown and described herein are illustrative of the invention and its best mode and are not intended to otherwise limit the scope of the present invention in any way. Furthermore, the connecting lines shown in the various figures contained herein are intended to represent exemplary functional relationships and/or physical couplings between the various elements. It should be noted that many alternative or additional functional relationships or physical connections may be present in a practical device.

As one skilled in the art will appreciate, the mechanism of the present invention may be suitably configured in any of several ways. It should be understood that the mechanism described herein with reference to the figures is but one exemplary embodiment of the invention and is not intended to limit the scope of the invention as described above.

It should be understood, however, that the detailed description and specific examples, while indicating exemplary embodiments of the present invention, are given for purposes of illustration only and not of limitation. Many changes and modifications within the scope of the instant invention may be made without departing from the spirit thereof, and the invention includes all such modifications. The corresponding structures, materials, acts, and equivalents of all elements in the claims below are intended to include any structure, material, or acts for performing the functions in combination with other claimed elements as specifically claimed. The scope of the invention should be determined by the appended claims and their legal equivalents, rather than by the examples given above. For example, the operations recited in any method claims may be executed in any order and are not limited to the order presented in the claims. Moreover, no element is essential to the practice of the invention unless specifically described herein as "critical" or "essential."

What is claimed is:

1. A double balanced image reject mixer (IRM) comprising:
   a radio frequency (RF) common port;
   four mixer devices, each of the four mixer devices comprising an intermediate frequency (IF) port, an RF port and a local oscillator (LO) port;
   a four-way splitter/combiner, wherein the four-way splitter/combiner is connected between the RF common port and the RF port of each of the four mixer devices;
   a digital four phase LO quadrature generator coupled between an LO common port and the LO port of each of the four mixer devices, the digital four phase LO quadrature generator comprising digital circuitry to digitally generate individual phase shifted LO signals for each of the four mixer devices based on a common LO signal at the LO common port, and to provide one of the individual phase shifted LO signals to the LO port of each of the four mixer devices; and a four phase IF quadrature generator coupled between an IF common port and the IF port of each of the four mixer devices, wherein the four phase IF quadrature generator converts between a common IF signal at the IF common port and individual phase shifted IF signals communicated with the IF port of each of the four mixer devices.

2. The double balanced IRM of claim 1, wherein each of the individual LO signal are 90° out of phase with another of the individual LO signals.

3. The double balanced IRM of claim 1, wherein the four phase IF quadrature generator comprises an IF balun and a first and second IF quadrature, wherein the IF balun converts between the common IF signal and first and second balun signals, wherein the first IF quadrature converts between the first balun signal and a first individual phase shifted IF signal and a second individual phase shifted IF signal of the individual phased shifted IF signals, and wherein the second IF quadrature converts between the second balun signal and a third individual phase shifted IF signal and a fourth individual phase shifted IF signal of the individual phase shifted IF signals.

4. The double balanced IRM of claim 1, wherein an individual phase shifted LO signal of the individual phase shifted LO signals provided to the LO port of a mixer device of the four mixer devices is phase paired with an individual phase shifted IF signal of the individual phase shifted IF signals communicated with the IF mixer port of the mixer device.

5. The double balanced IRM of claim 1, wherein each of the individual phase shifted IF signals are 90° out of phase with another of the individual phase shifted IF signals.

6. The double balanced IRM of claim 1, wherein the four phase IF quadrature generator comprises an IF balun in series with two parallel 0°/90° quadratures.

7. The double balanced IRM of claim 1, wherein:
the four-way splitter/combiner divides a common RF signal at the RF common port to generate individual RF signals, and provides one of the individual RF signals to the RF port of each of the four mixer devices;
the four mixer devices use the individual phase shifted LO signals to downconvert the individual RF signals and generate the individual phase shifted IF signals; and
the four phase IF quadrature generator combines the individual phase shifted IF signals to generate the common IF signal at the IF common port.

8. The double balanced IRM of claim 1, wherein:
the four phase IF quadrature generator divides the common IF signal at the IF common port to generate the individual phase shifted IF signals;
the four mixer devices use the individual LO signals to upconvert the individual phase shifted IF signals and generate individual RF signals at the RF port of each the four mixer devices; and
the four-way splitter/combiner combines the individual RF signals to generate a common RF signal at the RF common port.

9. The double balanced IRM of claim 8, wherein:
each of the individual RF signals includes a first sideband and a second sideband; and
the four-way splitter/combiner sums the first sideband of each of the individual RF signals and cancels the second sideband of each of the individual RF signals to generate the common RF signal.

10. A method of operating a double balanced image reject mixer (IRM), the method comprising:
digitally generating, using a digital four phase local oscillator (LO) generator comprising digital LO circuitry, individual phase shifted local oscillator (LO) signals for each of four mixer devices; and
converting, using the four mixer devices, between a common IF signal at an IF common port and a common radio frequency (RF) signal at a RF common port, wherein the converting between the common IF signal and the common RF signal comprises:
providing one of the individual LO signals to an LO port of each of the four mixer devices;
converting, using a four-way splitter/combiner, between the common RF signal and individual RF signals communicated with an RF port of each of the four mixer devices; and
converting, using a four phase intermediate frequency (IF) quadrature generator, between the common IF signal and individual phase shifted IF signals communicated with an IF port of each of the four mixer devices.

11. The method of claim 10, wherein:
converting between the common RF signal and individual RF signals comprises dividing, using the four-way splitter/combiner, the common RF signal to generate the individual RF signals, and providing one of the individual RF signals to the RF port of each of the four mixer devices;
downconverting, using the four mixer devices, the individual RF signals using the individual LO signals to generate the individual phase shifted IF signals; and
converting between the common IF signal and the individual phase shifted IF signals comprises combining, using the four phase IF quadrature generator, the individual phase shifted IF signals to generate the common IF signal at the IF common port.

12. The method of claim 10, wherein:
converting between the common IF signal and the individual phase shifted IF signals comprises dividing, using the four phase IF quadrature generator, the common IF signal to generate the individual phase shifted IF signals;
upconverting, using the four mixer devices, the individual phase shifted IF signals using the individual phase shifted LO signals to generate the individual RF signals; and
converting between the common RF signal and individual RF signals comprises combining, using the four-way splitter/combiner, the individual RF signals to generate the common RF signal.

* * * * *

UNITED STATES PATENT AND TRADEMARK OFFICE
CERTIFICATE OF CORRECTION

| | | |
|---|---|---|
| PATENT NO. | : 8,957,722 B2 | Page 1 of 1 |
| APPLICATION NO. | : 14/042054 | |
| DATED | : February 17, 2015 | |
| INVENTOR(S) | : Rob Zienkewicz and Kenneth Buer | |

It is certified that error appears in the above-identified patent and that said Letters Patent is hereby corrected as shown below:

In the Specification

In Column 6, line 25, the ")" after the reference numeral and degree symbol "90°" is excluded in error and should be added.

In the Claims

In Column 11, line 11, the words "phase shifted" after the word "individual" is excluded in error and should be added.

In Column 11, line 11, the word "signal" before the word "are" is included in error and should be removed.

In Column 11, line 11, the word "signals" before the word "are" is excluded in error and should be added.

In Column 11, line 12, the words "phase shifted" after the word "individual" is excluded in error and should be added.

Signed and Sealed this
Ninth Day of June, 2015

Michelle K. Lee
*Director of the United States Patent and Trademark Office*